(12) United States Patent
Killer et al.

(10) Patent No.: US 7,501,585 B2
(45) Date of Patent: Mar. 10, 2009

(54) SEMICONDUCTOR DEVICE SUPPORT ELEMENT WITH FLUID-TIGHT BOUNDARY

(75) Inventors: Thomas Killer, Hohenschambach (DE); Hans-Ludwig Althaus, Lappersdorf (DE); Melanie Ring, Munich (DE)

(73) Assignee: Infineon Technologies AG, Munich (DE)

(*) Notice: Subject to any disclaimer, the term of this patent is extended or adjusted under 35 U.S.C. 154(b) by 409 days.

(21) Appl. No.: 11/044,743

(22) Filed: Jan. 26, 2005

(65) Prior Publication Data
US 2005/0242447 A1 Nov. 3, 2005

Related U.S. Application Data

(60) Provisional application No. 60/566,816, filed on Apr. 29, 2004.

(51) Int. Cl.
*H05K 1/16* (2006.01)
(52) U.S. Cl. .............................. 174/260; 257/796
(58) Field of Classification Search ................ 174/260; 257/787–796
See application file for complete search history.

(56) References Cited

U.S. PATENT DOCUMENTS

| | | | | |
|---|---|---|---|---|
| 5,336,931 A | * | 8/1994 | Juskey et al. ................ 257/787 |
| 5,489,752 A | * | 2/1996 | Cognetti et al. ............. 174/266 |
| 5,900,581 A | * | 5/1999 | Ootake ....................... 174/523 |
| 5,907,190 A | * | 5/1999 | Ishikawa et al. ............ 257/795 |
| 6,458,547 B1 | * | 10/2002 | Bryan et al. ................ 435/7.1 |
| 6,762,509 B2 | * | 7/2004 | Hilton et al. ................ 257/787 |

* cited by examiner

*Primary Examiner*—Jeremy C Norris
(74) *Attorney, Agent, or Firm*—Eschweiler & Associates, LLC

(57) ABSTRACT

A support element and a semiconductor component including the support element, where the support element having at least one surface with a subregion for receiving a semiconductor device and at least one fluid-tight boundary, which is arranged on the surface and at least partly surrounds the subregion of the surface. A method is also disclosed for arranging a semiconductor device on the surface of a support element, with the steps of: providing a support element which has at least one surface with a subregion for receiving a semiconductor device and at least one fluid-tight boundary which is arranged on the surface and at least partly surrounds the subregion of the surface, introducing an adhesive fluid within the fluid-tight boundary, and introducing a semiconductor device into the adhesive fluid.

19 Claims, 3 Drawing Sheets

SEMICONDUCTOR DEVICE SUPPORT ELEMENT WITH FLUID-TIGHT BOUNDARY

RELATED APPLICATION

The present application claims priority of U.S. Patent Application Ser. No. 60/566,816 filed by Thomas Killer, Hans Ludwig Althaus and Melanie Ring on Apr. 29, 2004.

FIELD OF THE INVENTION

The invention relates to a support element for semiconductor devices, a semiconductor component with a support element and a method for connecting a semiconductor device to a support element.

BACKGROUND OF THE INVENTION

Support elements for semiconductor devices are used for combining smaller semiconductor devices to form larger units, which are then easier to handle. For example, semiconductor lasers are applied to such support elements, with contacting pads for the contacting of the semiconductor laser then being provided on the support element. In this way, a semiconductor laser module which is easier to handle and contact is provided.

In the case of such semiconductor constructions, usually a smaller chip, for example a semiconductor laser, is attached on a support element, usually a semiconductor substrate, having a greater extent. The attachment of a semiconductor device on a support element is often realized by soldering or by soldering processes, an air gap that is present between the semiconductor device and the support element then being sealed with an adhesive fluid. One result of this is that the air gap is sealed and another result is that the mechanical connection between the support element and the semiconductor device is improved.

To adhesively bond such a semiconductor device on the support element, firstly an adhesive in the form of an adhesive fluid is applied to the support element and then the semiconductor device is introduced or immersed into this adhesive fluid, so that an adhesive connection can occur between the two parts. The disadvantage of this is that the adhesive fluid can run or smear on the support element and thereby soil for example the contact pads or other regions of the support element. The tendency of the adhesive fluid to run or smear depends in this case on the viscosity of the adhesive fluid and its surface tension and also on the nature of the surface of the support element.

Such a support element 100 according to the prior art is shown in FIG. 7. Arranged on this support element 100 are three contact pads 500, and also a semiconductor device 300. The semiconductor device 300 is attached on the support element 100 by means of an adhesive fluid 400, the adhesive fluid 400 having been applied to the support element 100, where it has then run on the surface of the support element. In a region 450, the adhesive fluid 400 has flowed onto a contact pad 500 and soiled it.

The problem of the adhesive fluid running or smearing has until now been kept under control by dosing the adhesive fluid in very exact quantities and keeping its viscosity under close control. A disadvantage of this procedure is that the dosing of small amounts is laborious, and therefore increasing dosing accuracy also necessitates an increased dosing time and consequently a longer process time. Although increased viscosities of the adhesive fluid reduce the problem of the adhesive running, such high-viscosity fluids are difficult to process, so that here the viscosity of the adhesive fluid is subject to a process-related technical limit.

The adhesive fluid still had to be placed exactly on the support element to avoid even an exactly dosed and viscosity-controlled adhesive fluid running into undesired regions. Exact positioning of the fluid application is in turn cost-intensive and requires further process time.

A further possible way of avoiding soiling of contact pads or the surface of the support element was successfully found in making the distance between the adhesive fluid and the contact pads relatively great. However, this is not always desired in terms of structural design and for reasons of cost.

The object of the present invention is therefore to provide a support element for semiconductor devices, a semiconductor component, and also a method for connecting a semiconductor device to the surface of a support element, with which in each case a fluid, in particular an adhesive fluid, can be arranged without soiling other regions.

SUMMARY OF THE INVENTION

The invention provides a support element for semiconductor devices, the support element having at least one surface with a subregion for receiving a semiconductor device and at least one fluid-tight boundary, which is arranged on the surface and at least partly surrounds the subregion of the surface.

Within this subregion of the surface of the support element that is at least partly surrounded by a fluid-tight boundary, an adhesive fluid or some other fluid can be introduced without it running out from the surrounded region and soiling other regions. For example, a semiconductor device can then be easily immersed in the adhesive fluid and adhesively bonded in this way to the support element, or a fluid to be analyzed can be arranged within the fluid-tight boundary and be brought into contact with an analysis area.

The fluid-tight boundary according to the invention thereby prevents the fluid, in particular an adhesive fluid, from flowing on the support element. As a result, it is prevented in particular that contact pads are soiled with fluid or other regions that are not intended to come into contact with the fluid are damaged. Since running of the fluid on the support element is substantially prevented by the fluid-tight boundary, low-viscosity adhesive fluids can also be used. Furthermore, no particular requirements are placed on the accuracy of the positioning of the fluid applications; the fluid only needs to be applied within the fluid-tight boundary to the support element. It is also not necessary for the accuracy of the fluid dosing to be especially high, since possibly excessive fluid does not run on the support element, harming it. In this way, the speed of the process can be increased and the costs for the positioning accuracy and dosing accuracy can be reduced.

A fluid-tight boundary is understood here as meaning any possible boundary that is impermeable for the respective fluid and prevents running of a fluid. In principle, here it is a potential well, from which a fluid introduced within the fluid-tight boundary cannot run out. The fluid-tight boundary may in this case be formed by a frame arranged on the surface of the support element or some other elevation arranged on the surface of the support element, or else by a depression arranged in the surface of the support element.

The fluid-tight boundary may also be formed in such a way that the subregion is not completely surrounded and, in particular, comprises segments and/or is interrupted. One possible configuration consists for example in a U-shaped boundary, which prevents fluid from running into a specific region of the surface. With appropriate arrangement, such a fluid-tight boundary that is made up of segments or is interrupted also prevents the soiling of specific regions of the surface of the support element.

The support element preferably comprises semiconductor material and is in particular a semiconductor substrate, a semiconductor chip or a wafer.

The fluid-tight boundary is preferably formed in a polymer applied to the support element. In the case of semiconductors, it is customary to apply a polymer layer as the last layer, in order to seal the device. This process step is carried out in any case, so that an inexpensively achieved additional benefit can be obtained by further patterning of the polymer layer to form a fluid-tight boundary. The fluid-tight boundary can be easily patterned in such a polymer layer, such patterning in the polymer having the advantage that the fluid-tight boundary can have very great heights (for example 20 μm), compared with other patternable layers, for example of metals (for example 1 μm).

Furthermore, a polymer allows corresponding fluid-tight boundaries to be patterned or provided at any desired locations on the support element and then to serve for receiving a fluid.

A fluid by means of which for example a semiconductor device can be adhesively bonded to the support element may have been introduced within the fluid-tight boundary. In order to avoid soiling of contact pads, in an advantageous development of the invention at least one contacting pad for the electronic contacting of a semiconductor device is arranged on the surface of the support element outside the fluid-tight boundary. In this way a fluid arranged within the fluid-tight boundary is reliably prevented from flowing onto the contact pads.

For producing components which can be easily handled, the support element may be surrounded, in particular encapsulated, outside the fluid-tight boundary by a plastic casing. In this case, the fluid-tight boundary arranged on the surface serves as a barrier for the liquid plastic, so that the plastic cannot penetrate into the region surrounded by the fluid-tight boundary and so access to the support element remains open. Such a plastic casing is preferably chosen as a substantially non-transparent plastic. A corresponding component surrounded by plastic can then be formed as an SMD component, as a pin-through-hole component or as a component which can be contacted in some other way.

In a development of the invention, fluids which are to be analyzed for example in the field of medical engineering can also be received within the fluid-tight boundary. The analysis may be carried out by means of a semiconductor device likewise arranged within the fluid-tight boundary or by a sensitive area of the support element for the analysis of chemical and/or organic substances arranged within the fluid-tight boundary. For this purpose, a fluid to be analyzed is introduced within the fluid-tight boundary, for example by means of a pipette, and then analyzed with the respective component.

The invention also provides a semiconductor component with a support element for semiconductor devices, the support element having at least one surface with a subregion for receiving a semiconductor device and at least one fluid-tight boundary which is arranged on the surface and at least partly surrounds the subregion of the surface. Furthermore, a semiconductor device is arranged in the subregion of the surface of the support element. As a result, sound and quick connection of the semiconductor device to the support element is achieved and soiling of the remaining regions of the support element is avoided.

Preferably, the semiconductor device is adhesively bonded to the surface of the support element by an adhesive fluid arranged within the fluid-tight boundary. The dimensioning of the subregion surrounded by the fluid-tight boundary is in this case preferably made such that the semiconductor device arranged on the support element can be arranged completely within the fluid-tight boundary. This achieves the effect that the semiconductor device completely comes into contact with the surface of the support element—that is to say rests flat on it—and this surface is immersed completely in the adhesive fluid.

In a development of the invention, the semiconductor device is a semiconductor laser emitting through the support element and the intermediate space between the semiconductor laser and the support element is filled by means of a fluid, in particular by means of an immersion adhesive. This achieves the effect that a refractive index adaptation takes place between the semiconductor laser and the support element and in this way reflections and radiation losses at the surface of the support element can be prevented.

In a further refinement of the invention, the semiconductor device is arranged such that it rests substantially on the fluid-tight boundary.

The fluid-tight boundary serves in this case almost as an interface between the support element and the semiconductor device, so that the fluid-tight boundary serves as a seal between the support element and the semiconductor device, in order in this way for example to isolate a cavity. The fluid-tight boundary may in the case of this variant also act as a mechanical damper and compensate for mechanical shocks, vibrations and/or stresses between the support element and the semiconductor device. This allows for example materials with different coefficients of expansion to be combined more easily, since some of the stresses are absorbed by the fluid-tight boundary. The damping properties or the absorption of stresses described above can be achieved well by forming the fluid-tight boundary in a polymer.

In a development of the invention, the semiconductor device has at least one opening, via which fluids can flow into the closed-off space and/or out of the closed-off space. The semiconductor device preferably serves in this case for fluid analysis. In this way, a semiconductor component for the analysis of fluids can be formed, with a substantially closed-off analysis chamber being formed between the semiconductor device and the support element.

In a preferred development of the invention, a substantially opaque fluid is arranged on the support element and/or the semiconductor device. This can achieve the effect that the semiconductor device is sealed against light and, on the other hand, light emitted for example by a semiconductor laser is prevented from leaving at undesired points.

The invention also provides a method for arranging a semiconductor device on the surface of a support element, with the steps of: providing a support element which comprises at least one surface with a subregion for receiving a semiconductor device and at least one fluid-tight boundary which is arranged on the surface and at least partly surrounds the subregion of the surface. Furthermore, introducing a semiconductor device within the fluid-tight boundary and the adhesive fluid introducing an adhesive fluid likewise within the fluid-tight boundary.

This method has the advantages already described further above, that on the one hand a low positioning accuracy of the fluid application is necessary and on the other hand running of the fluid into undesired regions on the support element is prevented.

In a development of the method, firstly the semiconductor device is electrically contacted on the support element before the introduction of the adhesive fluid. For this purpose, the semiconductor device is preferably soldered on the support element. As a result, easy and reliable contacting of the semiconductor device is possible, also making it possible for heat from the semiconductor device to enter the support element.

Here, the support element also preferably comprises semiconductor material and is in particular formed as a semiconductor chip, semiconductor substrate or wafer.

In a further preferred method step, the adhesive fluid is introduced exclusively within the fluid-tight boundary. As a result, adhesive fluid is in turn prevented from running into undesired regions of the support element.

BRIEF DESCRIPTION OF THE DRAWINGS

The invention is explained in more detail below on the basis of the figures of the drawings, in which.

DESCRIPTION OF SEVERAL PREFERRED EXEMPLARY EMBODIMENTS

Figure 1:
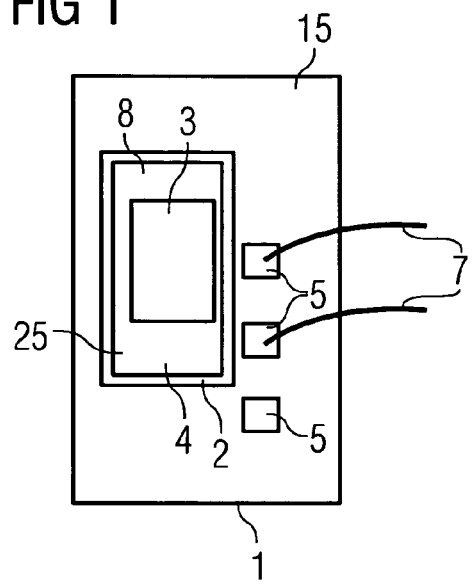
FIG. 1 shows a plan view of a schematically represented support element.

FIG. 1 shows a support element 1, as customarily used in semiconductor constructions, a semiconductor device 3 having been adhesively attached on the support element 1. The semiconductor device 3 has a smaller extent in the plane of the support element 1 than the support element 1 itself, so that space for further elements and structures still remains on the support element 1. For example, additionally arranged here on the support element 1 are three contact pads 5, which serve for the electrical contacting of the semiconductor device 3.

The semiconductor device 3 is formed here as a semiconductor laser, it then being easy for the contacting of the semiconductor laser 3 adhesively attached on the support element 1 to be carried out by means of the contact pads 5.

Arranged on the surface 15 of the support element 1 is a closed fluid-tight boundary 2, which encloses a region 25 surrounded by this boundary 2. The semiconductor device 3 lies completely within this boundary 2 and consequently completely in the region 25. Introduced within the fluid-tight boundary 2 is an adhesive fluid 4, by which the semiconductor device 3 is adhesively bonded to the support element 1.

Also arranged within the fluid-tight boundary 2 is a sensitive area 8 for the analysis of chemical and/or organic substances, which is not formed with any further refinements. A fluid arranged within the fluid-tight boundary 2 can thus be analyzed on this sensitive area 8.

Figure 2:
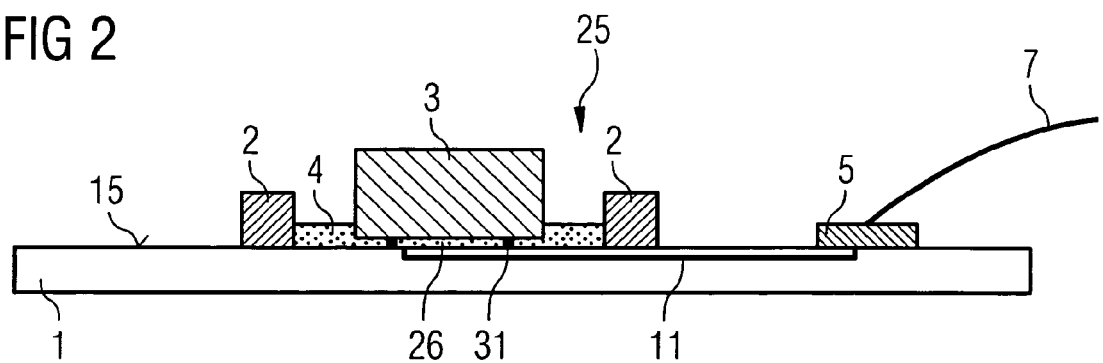
FIG. 2 shows a sectional representation of the support element of FIG. 1.

This construction, shown in FIG. 1 in plan view, is shown once again in FIG. 2 in a sectional representation.

In FIG. 2 it can clearly be seen that the adhesive fluid 4 is located exclusively in the region 25 surrounded by the fluid-tight boundary. The fluid-tight boundary 2 acts in this case like a potential well and prevents the adhesive fluid 4 from flowing onto the contact pads 5.

In the embodiment shown in FIGS. 1 and 2, the fluid-tight boundary is formed as a protective frame 2 arranged on the surface 15 of the support element 1. This frame 2 is formed for example by means of a polymer on the surface of the support element 1 formed as a semiconductor substrate. A polymer can be easily patterned and makes relatively high boundary walls possible in comparison with patterning for example in a metal. The use of a polymer thus allows pattern heights of for example about 20 µm to be achieved, which represents an advantage compared to other patternable layers, for example of metals (pattern heights about 1 µm).

As shown in FIG. 2, the semiconductor device 3 is contacted with conductor tracks 11 embedded in the support element 1 by means of contact pads 31. This contacting may take place for example by means of the soldering of the semiconductor device 3 with solder pads and/or in flip-chip mounting. The conductor tracks 11 are in electrical connection with the contact pads 5. Contacting of the semiconductor device 3 is therefore easily possible by means of wire bonds 7 connected to the contact pads 5.

The semiconductor laser 3 shown in FIG. 2 may be formed as a semiconductor laser emitting through the support element 1. The gap 26 formed between the semiconductor laser 3 and the surface 15 of the support element 1 is in this case filled by an immersion adhesive 4, so that a refractive index adaptation takes place between the semiconductor laser 3 and the support element 1. This reduces the losses caused by the sudden change in the refractive index between the air in the gap and the support element 1. However, such an immersion adhesive is usually of very low viscosity, so that use of this immersion adhesive is only possible within the fluid-tight boundary 2 without the adhesive fluid 4 flowing onto the contact pads 5.

Figure 3:
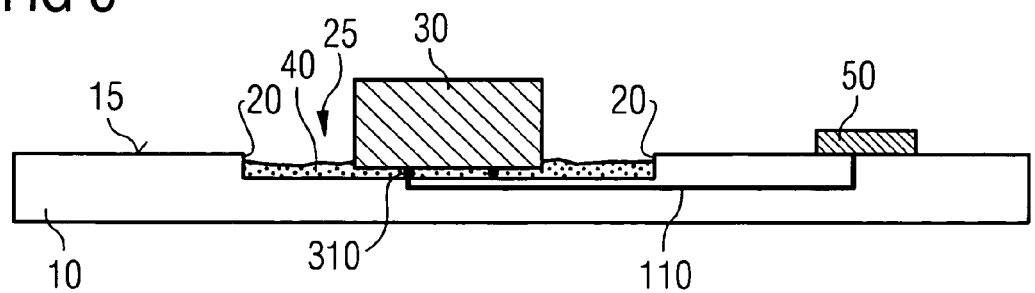
FIG. 3 shows a sectional representation of a support element in a second embodiment.

A variant of the embodiment of the invention shown in FIGS. 1 and 2 is shown in FIG. 3. The region 25 surrounded by a fluid-tight boundary 20 is formed here as a depression made in the support element 10. The side walls 20 of the depression serve here as the fluid-tight boundary. The region 25 surrounded by these side walls 20 serves here in turn for receiving the adhesive fluid 40. Just as in the embodiment presented above, the adhesive fluid 40 in turn cannot flow onto the contact pads 50, but remains in the intended region 25, on account of the potential barrier which is formed by the side walls 20.

A semiconductor device 30 can in this way easily be adhesively bonded to the support element 10. The region 25 surrounded by the fluid-tight boundaries 20 may be provided both as a depression directly in the support element 10 and in an additional layer applied to the surface 15 of the support element 10, for example a polymer layer.

Here, too, the contacting of the semiconductor device 30 takes place by means of contact pads 310, for example solder pads, which are in electrical connection with the contact pads 50 by means of conductor tracks 110.

Figure 4:
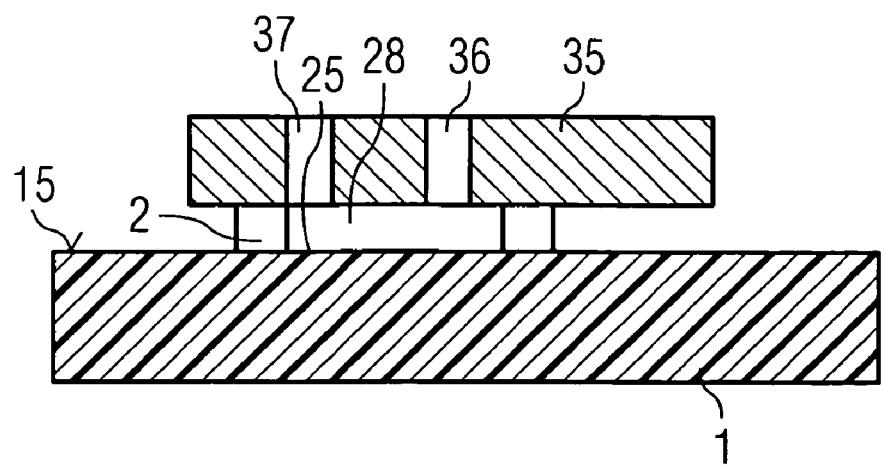
FIG. 4 shows a sectional representation of a semiconductor component in a further variant of the invention.

In FIG. 4, a further configuration of a semiconductor component with a support element 1 is shown. A fluid-tight boundary 2 has in turn been applied to the surface 15 of the support element 1. Arranged such that it rests on the fluid-tight boundary 2 is a semiconductor device 35, so that a space 28 which is closed off in a substantially fluid-tight manner is formed by the fluid-tight boundary 2 between the semiconductor device 35 and the surface 15 of the support element 1. The fluid-tight boundary 2 is in turn formed here from a polymer and consequently serves as a seal and at the same time also as shock absorption between the semiconductor device 35 and the support element 1.

Provided in the semiconductor device 35 are two openings 36 and 37, which serve for the exchange of fluid between the surrounding area and the closed-off space 28. The semiconductor device 35 is used here for fluid analysis, with which the fluid present in the closed-off space 28 can be analyzed. Fluid is understood here as also meaning a gas.

The variant shown in FIG. 4 also has the advantage that the fluid-tight boundary 2 serves as an interface between the support element 1 and the semiconductor device 35. With the fluid-tight boundary 2 formed from a polymer, it serves as a mechanical damper between the two parts and can in this way absorb shocks and stresses. For example, materials with different coefficients of expansion can thus be combined more easily, since some of the stresses are absorbed by the polymer.

Figure 5:
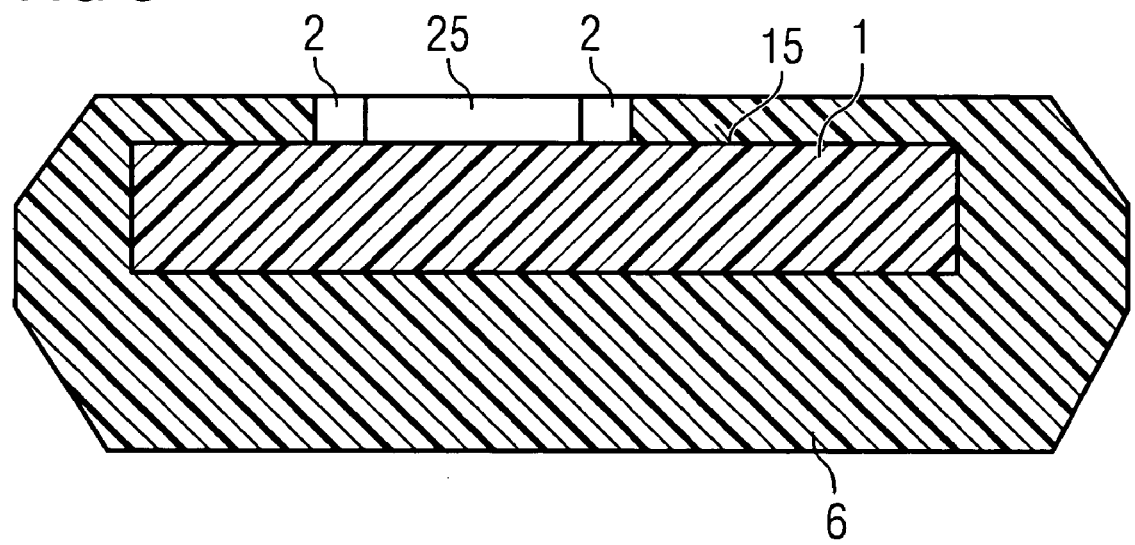
FIG. 5 shows a sectional representation through a support element encapsulated by a plastic casing.

A further variant of a semiconductor component or a support element 1 is shown in FIG. 5. A fluid-tight boundary 2, which encloses a region 25, has in turn been provided on the surface 15 of the support element 1. Outside the fluid-tight boundary 2, the support element 1 is encapsulated with a plastic casing 6. As a result, the regions of the support element 1 lying outside the by the fluid-tight boundaries 2 are protected by the encapsulation of plastic casing 6.

In this way it is possible for example for an easy to handle semiconductor component of the SMD type of design (surface mounting) to be produced. For encapsulating the support element 1, in this case the support element 1, with the fluid-tight boundaries 2 already applied, is pressed onto a surface of the injection mold. The fluid-tight boundary 2 thereby forms a seal where it meets the surface of the injection mold and in this way prevents the plastic from getting into a region within the fluid-tight boundary 2. As a result, it is possible to achieve an encapsulation of the support element 1 with a plastic casing 6 in which access to the interior of the plastic body is created.

Figure 6:
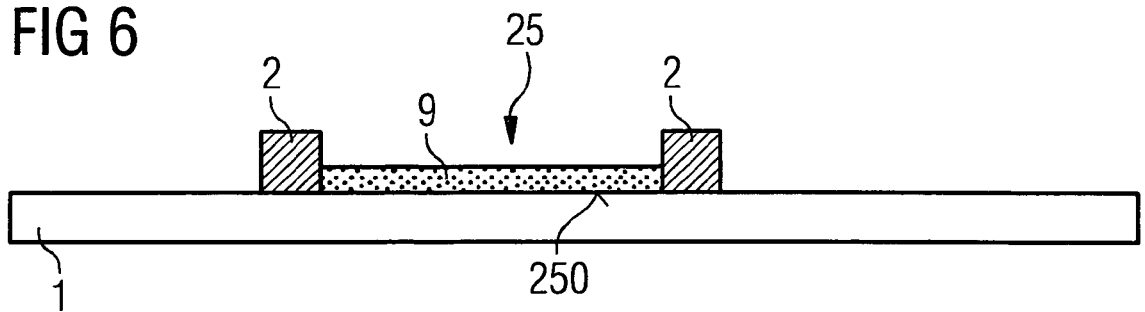
FIG. 6 shows a further embodiment of a support element.
Figure 7:
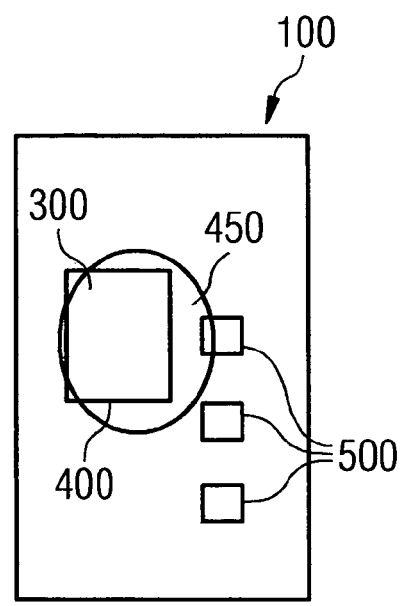
FIG. 7 shows a plan view of a schematically represented support element according to the prior art.

FIG. 6 shows a construction of a support element 1 which likewise has a subregion 25 of the surface of the support element surrounded by fluid-tight boundaries 2. Arranged within the fluid-tight boundaries 2 is a region 250 with light-sensitive components, for example light-sensitive transistors. This region 250 arranged between the fluid-tight boundaries is covered by a substantially opaque fluid 9, so that no disturbing stray radiation can reach the sensitive area 250. The covering of such regions is also known as a glob top. The fluid-tight boundaries avoid the substantially opaque fluid 9 flowing uncontrolled over the support element 1 and soiling other regions.

We claim:

1. A support element for a semiconductor device, the support element including at least one surface having a subregion for receiving the semiconductor device, wherein the support element comprises at least one fluid-tight boundary which is formed as an elevation arranged on the surface and at least partly surrounds the subregion of the surface, and wherein the support element further comprises means for analyzing at least one of chemical and organic substances arranged within the fluid-tight boundary.

2. The support element as claimed in claim 1, wherein the fluid-tight boundary is formed as a closed frame arranged on the surface.

3. The support element as claimed in claim 1, wherein the fluid-tight boundary is formed in a U-shaped manner.

4. The support element as claimed in claim 1, wherein the fluid-tight boundary comprises a polymer applied to the surface of the support element.

5. The support element as claimed in claim 1, further comprising a fluid introduced within the fluid-tight boundary.

6. The support element as claimed in claim 1, further comprising at least one contacting pad arranged on the surface of the support element outside the subregion surrounded by the fluid-tight boundary.

7. The support element as claimed in claim 1, further comprising a plastic casing encapsulating at least a portion of the support element located outside the subregion surrounded by the fluid-tight boundary.

8. The support element as claimed in claim 7, wherein the plastic casing is non-transparent.

9. The support element as claimed in claim 1, further comprising a substantially opaque fluid arranged within the fluid-tight boundary.

10. The support element as claimed in claim 1, wherein the support element comprises one of a semiconductor substrate, a semiconductor chip, and a semiconductor wafer.

11. A semiconductor component comprising:
a support element for supporting a semiconductor device, the support element including at least one surface having a subregion for receiving the semiconductor device, and at least one fluid-tight boundary which is formed as an elevation arranged on the surface and at least partly surrounds the subregion of the surface,
wherein the semiconductor device is arranged in the subregion of the surface of the support element, wherein an area covered by the semiconductor device is smaller than the subregion, such that the semiconductor device is arranged completely within the fluid-tight boundary, and wherein the support element further comprises at least one contacting pad arranged on the surface of the support element outside the subregion and within the fluid-tight boundary.

12. The semiconductor component as claimed in claim 11, wherein the semiconductor device is adhesively bonded to the surface of the support element by an adhesive fluid arranged within the fluid-tight boundary.

13. The semiconductor component as claimed in claim 11, wherein the semiconductor component is substantially surrounded by plastic.

14. The semiconductor component as claimed in claim 13, wherein the plastic is substantially non-transparent.

15. The semiconductor component as claimed in claim 11, wherein a substantially opaque fluid is arranged within the fluid-tight boundary.

16. The semiconductor component as claimed in claim 11, wherein the support element comprises one of a semiconductor chip, a semiconductor substrate, and a semiconductor wafer.

17. A semiconductor component comprising:
a support element for supporting a semiconductor device, the support element including a surface having a subregion for receiving the semiconductor device, and a fluid-tight boundary arranged on the surface and at least partly surrounding the subregion of the surface, wherein the semiconductor device is arranged in the subregion of the surface of the support element, and wherein the semiconductor device comprises a semiconductor laser arranged to emit a beam through the support element, wherein an intermediate space between the semiconductor laser and the support element is filled with an immersion adhesive.

18. A semiconductor component comprising:
a support element for supporting a semiconductor device, the support element including a surface having a subregion for receiving the semiconductor device, and a fluid-tight boundary which is arranged on the surface and at least partly surrounds the subregion of the surface, wherein the semiconductor device is arranged in the subregion of the surface of the support element such that it rests substantially on the fluid-tight boundary, and wherein a cavity which is closed off in a substantially fluid-tight manner is formed within the fluid-tight boundary between the surface of the support element and the semiconductor device, wherein the semiconductor device has at least one opening through which fluids can flow into the cavity and/or out of the cavity.

19. The semiconductor component as claimed in claim 18, wherein at least one of the semiconductor device and the support element comprises means for performing fluid analysis.

* * * * *